United States Patent [19]

Buckley

[11] 4,215,192

[45] Jul. 29, 1980

[54] X-RAY LITHOGRAPHY APPARATUS AND METHOD OF USE

[75] Inventor: William D. Buckley, Easton, Conn.

[73] Assignee: The Perkin-Elmer Corporation, Norwalk, Conn.

[21] Appl. No.: 869,541

[22] Filed: Jan. 16, 1978

[51] Int. Cl.² .............................................. B05D 3/06
[52] U.S. Cl. .................................. 430/270; 430/280; 430/325; 430/967
[58] Field of Search .......................................... 427/43

[56] References Cited

U.S. PATENT DOCUMENTS

| | | | |
|---|---|---|---|
| 3,742,229 | 6/1973 | Smith et al. | 427/43 |
| 3,742,230 | 6/1973 | Spears et al. | 427/43 |
| 3,743,842 | 7/1973 | Smith et al. | 427/43 |
| 4,035,522 | 7/1977 | Hatzakis | 427/43 |
| 4,061,829 | 12/1977 | Taylor | 427/43 |

OTHER PUBLICATIONS

Spears et al. "Electronic Letters" vol. 8, No. 4, pp. 102–104.
Poyner "Vacuum" vol. 26, No. 10/11, pp. 471, 472.
Buckley "Electron and Ion Beam Science and Technology, Seventh International Conf." The Electrochem. Soc. 1976, pp. 453–463.
Cosslett et al. *X-ray Microscopy* p. 228, University Press Cambridge (1960).
Birks, *X-ray Spectrochemical Analysis* p. 14, Interscience Publishers Inc., New York (1959).
Bernacki et al. "IEEE Transactions on Electron Devices" vol. Ed–22, No. 7, Jul. 1975, pp. 421–428.
Maydan et al. "IEEE Trans. on Electron Devices" vol. Ed–22, No. 7, Jul. 1975, pp. 429–433.
McCoy "SPIE vol. 100 Semiconductor Microlithography II" (1977) pp. 162–171.
Spears et al. "Solid State Technology" Jul. 1972, pp. 21–26.
Feder et al. "IBM Tech. Disc. Bull." V. 18, No. 7, 12–1975, pp. 2343–2345.
Fredericks et al. "IBM Tech. Disc. Bull." V. 19, no. 11 p. 4193.
*Handbook of Chemistry and Physics* 1976, 57th ed. CRC Press Inc., Cleve., Ohio. pp. E 175–E 180.
Wardly et al. "Application des Rayons X en Microlithographie" Proc. Int. Conf. on Microlithography, Microelectronics and Optics, Paris, Jun. 21–Jun. 24, 1977.

Primary Examiner—John H. Newsome
Attorney, Agent, or Firm—S. A. Giarratana; F. L. Masselle; E. T. Grimes

[57] ABSTRACT

In order to obtain shorter exposure time and to obtain a longer life in x-ray lithography apparatus, an x-ray target made of tungsten is utilized and the apparatus operated to generate the tungsten M-line, this line being at a wavelength which will be absorbed by the resist normally used in lithography. To develop the resist, which was initially designed for use in an electron beam lithography, a developing method is used in which a initial short development with a high concentration is first carried out followed by a longer, full development with a concentration which is approximately the lowest at which complete development will take place.

16 Claims, 5 Drawing Figures

X-RAY LITHOGRAPHY APPARATUS AND METHOD OF USE

BACKGROUND OF THE INVENTION

This invention relates to x-ray lithography in general and more particularly to an improved apparatus for generating x-rays for lithography and a method of using that apparatus.

With the need for better resolution in the lithography used in manufacturing microcircuits new processes have been investigated. X-ray lithography has been proposed as a solution to the resolution problem. For example, see the article published in Electronic Letters, Feb. 24, 1972, Volume 8, Number 4, at page 103 by D. L. Spears and Henry I. Smith of the Lincoln Laboratory at the Massachusetts Institute of Technology. The use of x-rays permits shorter wavelengths to be used. For example, the wavelength for the x-rays of interest is approximately 10 angstroms as compared to a wavelength of 4,000 angstroms in ultraviolet.

The most commonly used x-ray target for lithography has been aluminum. The aluminum K-line is at about 8 angstroms which has been found to be a good wavelength for x-ray lithography. Basically, wavelengths between 4 and 14 angstroms are usable. However, using an aluminum target results in numerous disadvantages. Aluminum is subject to stress cracking and has a fairly low melting point. For these reasons, the amount of power which can be put into the system is limited if the aluminum is not to crack or melt. Because of these various factors, exposure time when using an aluminum target is relatively long. Because of these factors, the lifetime of an aluminum x-ray tube which operated at high power to get short exposure times is severly limited. For a typical design using an aluminum target, see the IBM Research Report entitled "High Brightness Ring Cathode Rotating Anode Source for X-ray Lithography" by G. A. Wardly et al. The use of a rotating anode to permit higher powers, which in itself was previously known, is described. Even with such a target, the maximum power is limited.

Traditional x-ray targets, which have been used for medical, dental and similar purposes, utilize a high melting point target such as tungsten. However, tungsten has not previously been used for x-ray lighography because of the short wavelength radiation which it exhibits in the K-region; less than half an angstrom. Such a wavelength is not absorbed into the resist used on the microcircuit and thus cannot be used for x-ray lithography. Spears et al in the aforementioned paper did suggest the possibility of a tungsten target utilizing the continium radiation. However, the results were not particularly promising. As noted, they had exposure times from 5 to 10 hours. With the mask structure used, the broad spectral distribution gave rise to an exposure contrast between the opaque and transparent regions of less than 3:1.

It is well recognized that of prime importance in x-ray lithography, in addition to the need for good resolution, is the ability to process a large number of circuits in a short time. This dictates a short exposure time. In order to get a short exposure time generally requires increased power. To get high power requires a high melting point source.

Another approach taken has been to use a palladium or rhodium source and to dope the resist which is used to cause it to better absorb the radiation which is still relatively short at about 4 angstroms. Although this improves the processing time, it requires the use of a doped resist. In this method, it is not an increase of power which gives the shorter exposure time, but the response of the doped resist to the radiation.

Thus, the need for an improved apparatus for x-ray lithography and a method of using that apparatus quickly, efficiently and accurately to carry out a photo lithographical process, particularly for use in constructing microcircuits, becomes evident.

SUMMARY OF THE INVENTION

In its broadest aspects, the present invention comprises, using a target which will generate M-line x-ray radiation in x-ray lithography apparatus and operating the apparatus so as to insure generation of the M-line. For, it has been discovered that, although previous investigators considered the M-line to be too inefficient for this purpose, this line can be effective and is at a wavelength which is readily absorbed by the resist, permitting shorter exposure times over those that were previously possible particularly in view of the ability to operate the target at a higher power. Preferably, an element with high power density that is, an element capable of absorbing energy at a high power density is used. In the illustrated embodiment, tungsten is the element. In order to generate the tungsten M-line efficiently, it is necessary to operate the x-ray source at a voltage of more than 5 Kv, preferably in the range of 20 Kv. Further, the window through which the x-rays from the target pass must be kept as thin as possible.

The apparatus of the present invention includes a source portion having an electron gun directed at a tungsten target. In conventional fashion, the accelerated electrons from the gun impinging on the target generate x-rays. In order to maintain good resolution, the beam diameter is kept small. Preferably, the target is both rotated and water cooled to permit better power dissipation. The source is operated under a vacuum. The x-ray source is spaced from and arranged to divert its radiation toward the substrate coated with resist which is to be exposed. A mask with an absorber material is interposed between the x-ray source and the substrate. X-rays are emitted through a window, preferably of beryllium, which is transparent to the x-ray radiation. The window is necessary because of the operation of the source under a vacuum. As noted, the window should be as thin as possible. Although a 100 $\mu$m window would operate inefficiently, it is preferred that the window have a thickness of 25 $\mu$m or less. The remainder of the system may be operated under a vacuum, in a helium atmosphere or in air, for example.

The apparatus of the present invention can be used with the conventional COP resist. This is the copolymer resist poly(glycidyl methacrylate-co-ethyl acrylate) referred to by McCoy in SPIE, Vol. 100 Semiconductor Microlithography II (1977) pages 162 et seq. at page 165 line 12. However, a special developing process is necessary to obtain good results. This resist which was designed initially for use in electron beam lithography was discovered to develop with certain defects unless the process of the present invention was followed. Thus, in accordance with the present invention after exposing for less than a minute through a mask using absorbers, preferably of gold, and generating x-rays with a tungsten source, the resist is developed first in a strong developing solution and then in a weaker developing solution having a strength which is not much greater than that required if complete development is to take place, with an overlap between the two developing steps.

A further feature of the present invention resides in an improved sealing means for the beryllium window. Because beryllium is rather rough, the window has disposed on each side of it indium seals which in turn contact copper cooling bodies. With this arrangement, in which the window is clamped between two indium seals, a good vacuum seal is obtained.

The use of tungsten as the target offers numerous advantages. As alluded to above, it permits operating at higher power density, thereby reducing exposure time. Furthermore, contamination of the target by the tungsten filament with the electron gun is no longer a problem. In general, the arrangement of the present invention permits operating at high power density thereby giving shorter exposure times and permits the x-ray tube, i.e., the source including the electron gun and target, to have an extended life over that which was possible using an aluminum target.

A further advantage and feature of the present invention is the availability of tungsten L-line radiation for use in mask alignment. Since the soft M-line radiation can easily be filtered out by a filter which will pass the L-line radiation, which will not be absorbed by the resist, such becomes quite practical. The type of alignment system with which such use is possible in disclosed in a paper entitled "Precision Mask alignment for X-Ray Lithography" by J. H. McCoy et al, published in the Proceedings of the 7th International Conference on Electron and Ion Beam Science and Technology of 1976 by the Electrochemical Society.

DETAILED DESCRIPTION OF THE INVENTION

Figure 1:
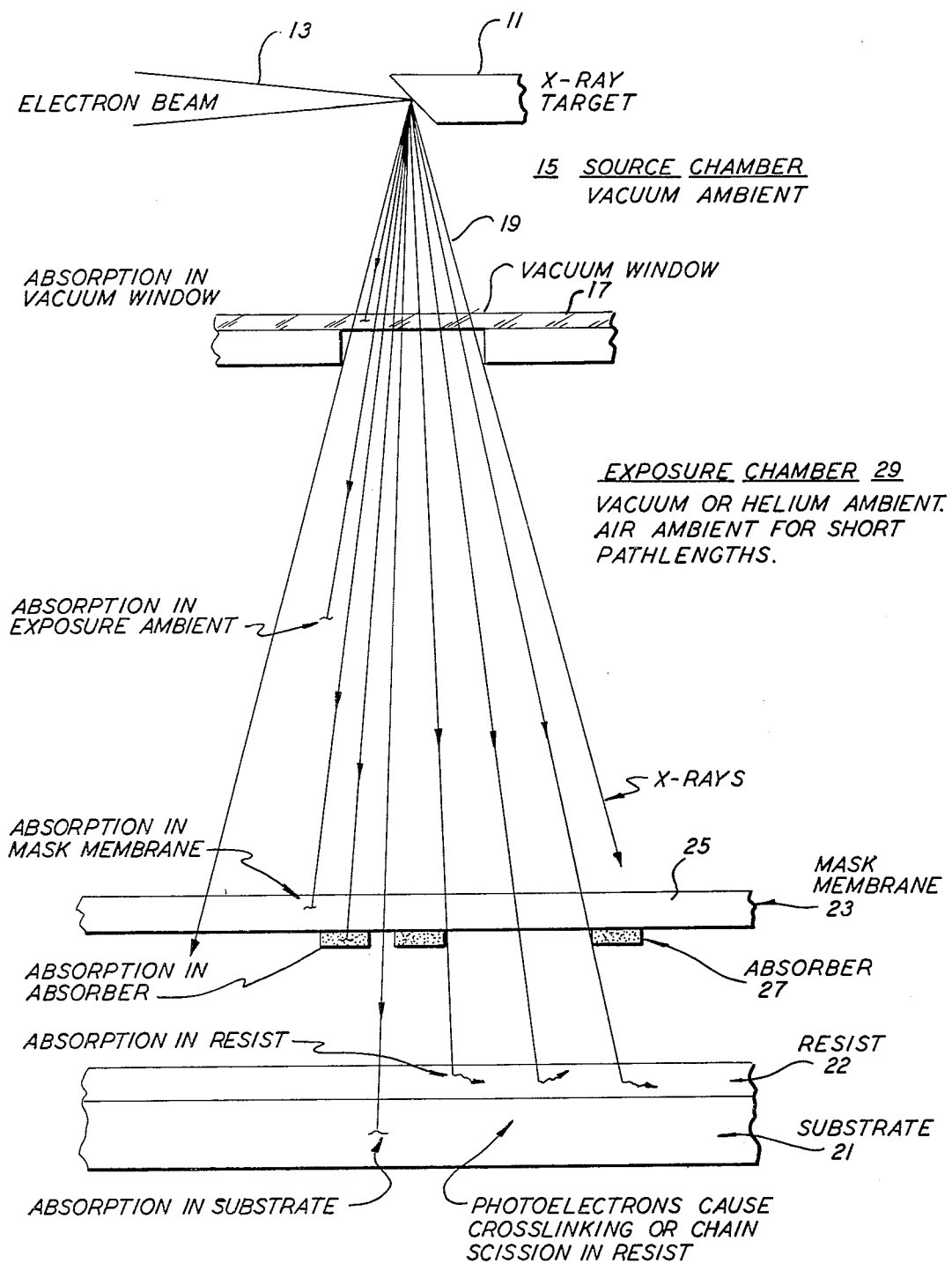
FIG. 1 is a schematic elevational view of an x-ray lithography apparatus.

FIG. 1 is helpful in gaining a general understanding of the x-ray lighography process. As in any conventional x-ray system, x-rays are generated by striking an x-ray target 11 with an electron beam 13. For the purpose of obtaining good resolution, it is desirable that the x-ray source be as close to a point source as possible. This dictates a small spot size on the target. The electron beam and x-ray target are contained within a source chamber 15 which is under a vacuum. This requires that there be a vacuum window through which the x-rays generated at the target can pass. Thus, there is shown a window 17. Window 17 can be made of any material which is transparent to the wavelength of the x-rays being generated. Typically, beryllium is used as a window material. The generated x-rays 19 pass through the window with a certain portion of the x-rays being absorbed thereby. The x-rays are directed toward a substrate 21 containing a resist 22 thereon. Interposed between the source and resist is a mask generally indicated at 23. The mask will include a mask membrane 25 with a pattern deposited thereon in an absorber material 27 such as gold. The absorber material absorbs the x-rays in those areas where it is present, preventing the corresponding areas of the resist from being exposed to the radiation. After exposure for the required length of time, the resist is then developed and further processing of the substrate carried out. As indicated on the figure, absorption into the resist causes a cross-linking (negative resist) or chain scission (positive resist) in the resist to then permit selective developing of the resist. Typically, the resist used is a negative resist meaning that the areas which are not exposed will be developed away during the developing process. Of course, a positive resist can also be used.

The portion of the apparatus in which the mask and substrate are located is designated as an exposure chamber 29. It can operate in a vacuum, helium or even air ambient atmosphere. The latter applies where the distances are short.

As indicated above, it has been typical in the prior art to mask the x-ray target 11 from aluminum. However, because of the low melting point of aluminum, and keeping in mind that the spot must be small, even with the target water cooled and rotated to expose different areas of the target at different times, the power is limited and exposure times are long. As an alternative, use of the palladium as source with a doped resist has been tried. This increases absorption in the resist permitting shorter exposure times at low power. However, this means that a special resist must be used thereby reducing the flexibility of the system.

With the wavelengths developed with an aluminum target, the thickness of the absorbers 27 required is approximately 0.4 $\mu$m. Naturally, an absorber which must be too thick cannot be used because of problems of making the mask, i.e., refining small geometries in thick films. Using the aforementioned palladium, the required thickness is 0.7 $\mu$m. Typically, the width of an absorber is 1 $\mu$m or less so that both of these sizes are possible although the thicker mask needed for palladium is a little more difficult.

In accordance with the present invention, however, the x-ray target is made of tungsten. The electron beam 13 is generated to be at a sufficiently high voltage, for example 20 kv, so as to generate a tungsten M-line which is approximately 7 angstroms in wavelength. It has been previously thought that not enough radiation could be developed with such an M-line. However, tests have shown this not to be true, and extremely good results have been obtained. The absorber 27 thickness need only be about 0.5 $\mu$m using tungsten.

Figure 2:
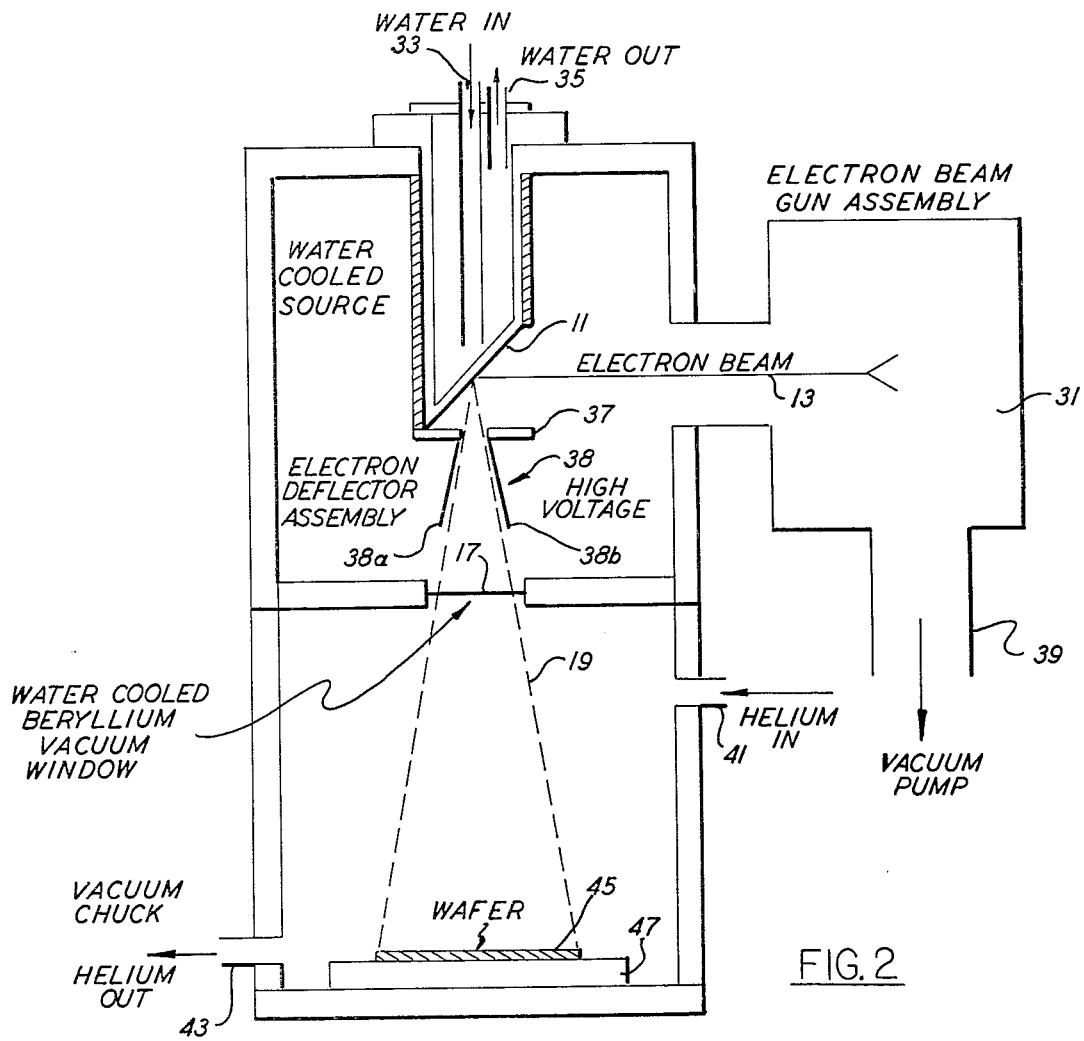
FIG. 2 is a similar view of a type of apparatus used in testing out the principle of the present invention.

FIG. 2 illustrates the experimental apparatus used for testing out the present invention. Parts that are the same as FIG. 1 are given the same reference numerals. The electron beam 13 is generated by an electron gun assembly 31. In the case of the experimental model, this electron gun was an electron beam welding gun. The beam 13 impinges on a target 11 made of tungsten. The target is water cooled with a water inlet line 33 and water outlet line 35 provided. Directly below the target is an aperture plate 37 at ground potential. Below aperture plate 37 is an electron deflector assembly 38, comprising a plate 38a at ground potential and a plate 38b at a high voltage, for gathering in any electrons which are reflected from the source 11. This plate 38b is at a high voltage so as to deflect these electrons to plate 38a. As before, a beryllium vacuum window 17 is provided and is water cooled in conventional fashion. The aperture plate 37 and deflector assembly 38 prevents bombardment of window 17 with electrons, which bombardment could cause overheating. The portion of the system including the electron gun assembly 31 and the area of the apparatus above the window 17 is maintained under a vacuum with a vacuum outlet 39 provided and coupled to a vacuum pump. The lower portion of the apparatus is maintained in a helium atmosphere with a helium inlet line 41 and helium outlet line 43 provided for that purpose. The wafer which is to be exposed is held in conventional fashion on a vacuum chuck 47. The window 17 was about 25 $\mu$m thick. As shown in FIG. 1, there will be a mask (not shown) directly above the wafer.

Table 1 below gives some calculated performance data, based on experimental work and published literature, making a comparison between the tungsten target of the present invention, the conventionally used aluminum target and the palladium system developed by Bell Labs which uses a resist doped with chlorine. The other two systems use a conventional COP resist.

In Table I, Example 1, the data for the palladium-chlorine system is based on published values. That published data relates to 5 killowatts and, for the table, this is extrapolated to 10 killowatts. The power selected in this example is held constant at 10 killowatts. With this power, the aluminum system using COP resist, for a resolution of 0.24 $\mu$m, requires an exposure time of 280 seconds. The palladium-chlorine system, for the same resolution, requires an exposure time of 60 seconds. The example for tungsten is one using a smaller spot to take advantage of the power capabilities, i.e., the spot is more concentrated. For this case, the exposure time is 280 seconds.

In Example 2, the resolution is held constant at 0.24 $\mu$m. The power for the aluminum and palladium systems is still limited to 10 killowatts but the tungsten power is now raised to 57 killowatts, tungsten being the only material of the group capable of handling this power. The results, with respect to exposure time, are that the palladium-chlorine system still has an exposure time of 60 seconds, the aluminum system 280 seconds but the tungsten system now requires an exposure of only 49 seconds.

Example 3 is again one in which the resolution is held constant. In addition, the distance between the target and the substrate is optimized based on calculations and experimental work done. Thus, rather than the conventional distance of 50 centimeters, the distance is now reduced to 15 centimeters. Because of this reduction in distance, the spot size must be correspondingly smaller. With a smaller spot size, the aluminum system and palladium system must operate at a reduced power. Thus, the aluminum system is shown as operating at 1.7 killowatts and the palladium system at 1.6 killowatts. The tungsten system also operates at a reduced power of 9.2 killowatts. With these parameters, the exposure time for aluminum is 205 seconds; for palladium-chlorine 35 seconds; and for tungsten 37 seconds.

Finally, Example 4 is one in which the resolution is selected to be 0.5. The number is selected since it is thought that, for state of the art systems, resolution above this is unnecessary. Again, the optimum distance D=15 centimeters is used. Because the spot size can now be larger, each of the systems can be operated at a higher power. With these parameters, the exposure times for the tungsten and the palladium-chlorine systems are both 17 seconds and for the aluminum 93 seconds. Thus, under optimum conditions, with an aluminum system, the minimum exposure time reaches only 93 seconds. The palladium system and the tungsten systems are almost an order of magnitude lower. However, as noted above, the palladium system is much less universal and requires the use of doped resist. With respect to the universal use of the various systems, the last column of the Table is instructive. This shows, with the same conditions as given in the 4th example, the exposure times when using a conventional ultraviolet 747 resist manufactured by Eastman-Kodak. As illustrated, the exposure time for the tungsten system increases to only 60 seconds whereas for aluminum, the increase is to 300 seconds and in using the palladium source without doping, the time increases to 600 seconds.

TABLE I

| X-RAY LITHOGRAPHY SYSTEM COMPARISON | | | | |
|---|---|---|---|---|
| EXAMPLE | W COP | Al COP | Pd CL | CONSTANT PARAMETERS |
| 1. POWER (KW) | 10 | 10 | 10 | POWER, D, d |
| RESOLUTION ($\mu$m) | 0.08 | 0.24 | 0.24 | |
| EXPOSURE TIME (SECONDS) | 280 | 280 | 60 | D = 50 cm |
| 2. POWER (KW) | 57 | 10 | 10 | P, d, D, S |
| RESOLUTION ($\mu$m) | 0.24 | 0.24 | 0.24 | |
| EXPOSURE TIME (SECONDS) | 49 | 280 | 60 | D = 50 cm |
| 3. POWER (KW) | 9.2 | 1.7 | 1.6 | P, d, D, S |
| RESOLUTION ($\mu$m) | 0.24 | 0.24 | 0.24 | |
| EXPOSURE TIME (SECONDS) | 37 | 205 | 35 | D = 15 cm |
| 4. POWER (KW) | 20.0 | 3.75 | 3.4 | P, d, D, S |
| RESOLUTION ($\mu$m) | 0.5 | 0.5 | 0.5 | |
| EXPOSURE TIME (SECONDS) | 17 | 93 | 17 | D = 15 cm |
| 747 RESIST | ≃60 | ≃300 | ≃600 | |

P = RESOLUTION
D = SOURCE - WAFER DISTANCE
d = MASK - WAFER DISTANCE
S = SPOT DIAMETER

Figure 3:
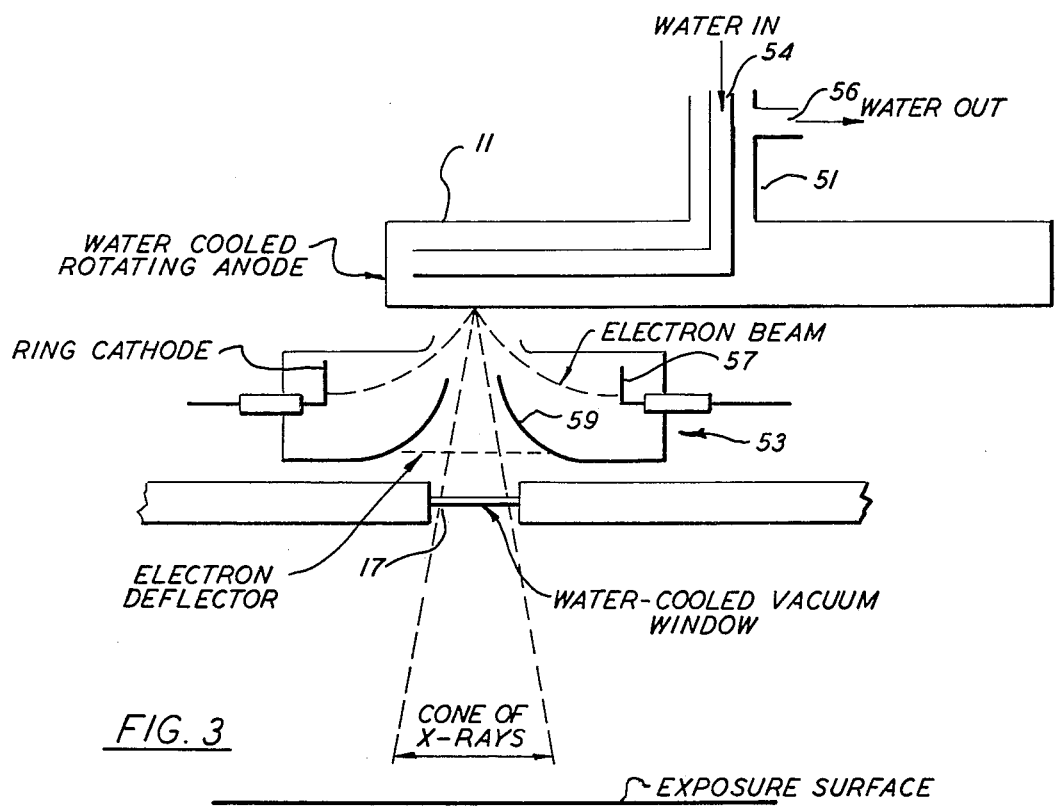
FIG. 3 illustrates a simpler type of gun design which may be used with the x-ray lighography apparatus of the present invention.

The use of tungsten also permits a much simpler gun design because tungsten contamination of the tungsten target is not a problem. Such a design is illustrated by FIG. 3. This design is quite similar to that disclosed in the paper "The design and development of a ring cathode electron gun as an evaporation source" by G. T. Poyner published in Vacuum, Vol. 26, No. 10/11. The difference is that the gun is used to impinge electrons on a target rather than as an evaporation source. Such a device for evaporation is commercially available from Craswell Scientific Limited under the name RG3 Twin Film Electron Bombardment source. As shown by FIG. 3, target 11 in this case is disposed on a shaft 51 permitting rotation. The shaft contains appropriate passages 54 and 56 for cooling water so that it can, at the same time, be water cooled. The gun assembly 53 is particularly simple and permits placing the window 17 much closer than previously possible. As shown, the gun includes a ring cathode 57 from which electrons eminate and strike target 11. The electron deflector 59 is quite simple since it attaches near the cathode. Because the window 17 is closer, it can be made thinner and still support the vacuum which results in a pressure on the window of approximately 15 pounds per square inch. Naturally, by making the beryllium window thinner, it will absorb less radiation making M-line radiation more efficient. Above 100 μm there will be a significant decline in efficiency. Preferably, the window will have a thickness of no greater than 25 μm.

Figure 4:
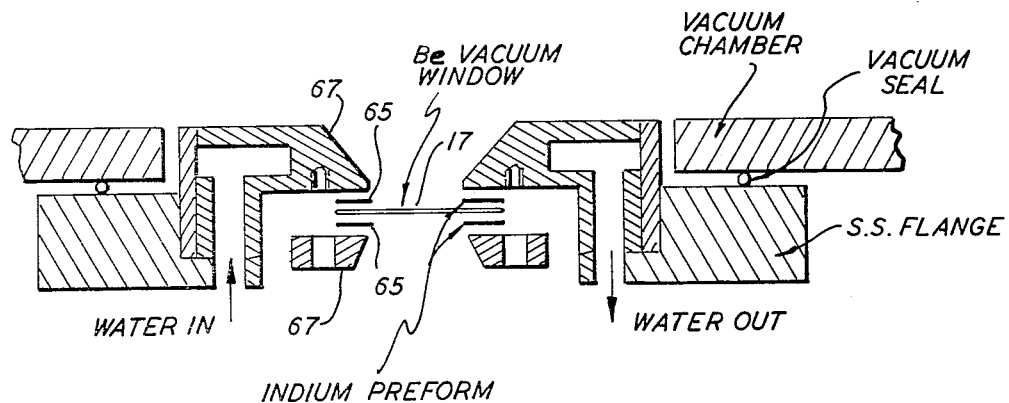
FIG. 4 is a cross sectional view of the sealing means of the beryllium window used in the apparatus of FIGS. 1 or 2 in accordance with the present invention.

In accordance with another feature of the present invention, as shown on FIG. 4, the beryllium window 17, beryllium being rather a rough substance, is maintained between two indium seals 65. Indium is relatively soft and thus will fill in gaps. On each side of the indium seals are pieces of copper 67 which are water cooled to remove the heat from the beryllium window 17.

With respect to the gun design, it should be noted that, with an aluminum target, it was necessary to use a design where the filament of the electron gun did not see or have a direct line of sight to the aluminum target. This was to avoid the possibility of tungsten being deposited on the aluminum and eventually making it useless. With the tungsten target of the present invention, this is no longer a problem since any tungsten deposited would be the same element of which the target was made.

Although tungsten is the preferred material, any of the elements which are capable of generating an M-line may be used as a target. Materials with high power density are preferred. Table II below lists, for a number of possible elements, the M-line wavelengths in angstroms. For a more detailed list, see Handbook of X-Rays edited by Emmett F. Kaelble (McGraw Hill 1967) particularly pages 1-19. Other absorbers than gold may be also used, the selection being made from Standard Tables such as given in "X-Ray Absorption Uncertainty" by K. F. Heinrich (from The Electron Microprobe, 1966, N.Y. J. Wiley, pages 296-378.)

It will be recognized that when speaking of using these elements as targets, alloys and compounds of the elements are also included. Thus, for example, an alloy of tungsten and rhenium, which has been used in medical x-ray targets, may also be used.

Using a tungsten source and the M-line, the thickness of the absorbers on the mask must be approximately 0.5 μm. This is only slightly greater than what is required when using an aluminum source and quite a bit less than what is required with a palladium source. With the other elements given in Table II, the thickness will of course depend on the wavelength, the longer the wavelength the less the thickness required.

TABLE II

| M-LINE X-RAY SOURCES | |
|---|---|
| Element | M-LINE WAVELENGTH A |
| Yb | 8.14 |
| Lu | 7.84 |
| Hf | 7.54 |
| Ta | 7.25 |
| W | 6.98 |
| Re | 6.53 |
| Os | 4.49 |
| Ir | 6.26 |
| Pt | 6.05 |
| Au | 5.85 |

Although it is preferred that the window be made of beryllium, other elements may be used. In general, a low atomic number is required. Other possibilities include lithium and boron, both of which are hard to work with. Again, the general requirement is that it be a material which will pass the wavelengths being used.

It should also be noted that doping of the resist, for example, with bromine, is also possible if it is desired to further speed up the process. (See the aforementioned publication by Heinrich which shows bromine to be a good absorber for the tungsten M-Line.)

Figure 5:
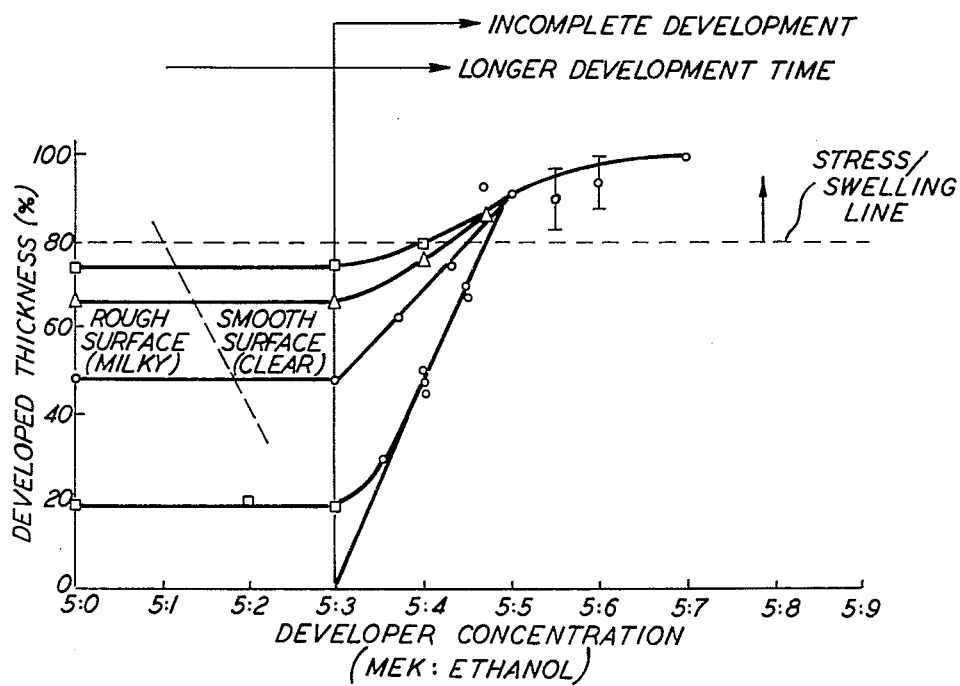
FIG. 5 is a graphic representation illustrating the developing process of the present invention.

As noted above, conventional COP resist available from Mead Chemical, Rolla, Missouri, can be used as the resist with the apparatus of the present invention. However, it has been discovered that a special developing process of this resist is required in order to get good results. This can best be explained in conjunction with FIG. 5. On this figure, the developed thickness in percent is plotted with respect to the developer concentration. The developed thickness is a quantity which is directly proportional to the incident x-ray dose. The developer concentration shown is that of the developer, MEK, to the solvent ethanol. It can be seen that with a concentration of less than 5:3, incomplete development takes place. In general, it has been discovered that, using a ratio of about 5.3 for the complete development, certain problems occur. Thus, in accordance with a further feature of the present invention, after exposure with the x-rays, the exposed resist is first developed with a strong developer concentration, for example, a concentration of 5:1.8, whereafter, the resist then is completely developed in a 5:2.7 solution. Development is carried out using a spraying technique using spray guns in conventional fashion with an overlap between the two steps. FIG. 4 also shows that with a developed thickness of over 80%, stress and swelling lines can develop. Thus, it is preferred that 80% be the upper limit on developed thickness, although it may be possible to go above 80%. Using a 50% developed thickness, the resist was developed by spraying with the 5:1.8 solution first for 5 sec.; then spraying with both the 5:1.8 and 5:2.7 solutions (overlap) for 10 sec.; and then with the 5:2.7 solution for 5 more sec. Subsequent rinsing is optional.

As noted above, the use of the tungsten source also permits utilizing the tungsten L-line radiation which is at 1.476 angstroms for alignment purposes. This L-line radiation is unable to expose resist but can be used in an alignment system such as that taught in the aforementioned paper by McCoy et al. To use the system for alignment, a filter such as 25 μm of aluminum is placed directly below the window 17 shown in FIGS. 1, 2 or 3. The source is then activated with the filter filtering out the soft M-line radiation but passing the hard L-line radiation. This radiation has no effect on the resist but can be detected by suitable fluorescent detectors as described in the aforementioned paper.

Finally, although it is the M-line radiation which primarily exposes the resist, there may also be a contribution from the continuum radiation.

What is claimed is:

1. A method of performing x-ray lithography comprising:
   (a) coating the substrate on which the lithography is to be carried out with a resist;
   (b) disposing an x-ray apparatus having a target means capable of generating M-line x-ray radiation having a wavelength in the range of between about 4 and about 14 angstroms so as to generate radiation which will impinge on and expose said coated substrate;

(c) operating said x-ray source so as to generate the M-line radiation;

(d) disposing a mask between said source and said substrate; and (e) exposing said substrate to said radiation.

2. The method of claim 1 wherein said target is selected from the group consisting of tungsten, alloys of tungsten, and tungsten compounds, so as to generate a tungsten M-line.

3. The method of claim 2 wherein said step of operating comprises operating said x-ray source at a voltage above 5 kv.

4. The method according to claim 3 wherein said step of operating comprises operating at a voltage in the vincinity of 20 kv.

5. The method according to claim 4 wherein said step of operating includes using as a window in said x-ray apparatus a window made of beryllium and having a thickness of not more than 100 μm.

6. The method according to claim 5 wherein said step of disposing comprises disposing a window which has a thickness no greater than 25 μm.

7. The method of claim 1 wherein said resist is COP resist and further including the steps of first developing the exposed resist in a developing solution having a concentration of approximately 5:1.8, the concentration being the ratio of MEK developer to an ethanol solvent for a short period of time and then developing said resist in a developer concentration of approximately 5:2.7 until all of said resist is developed.

8. The method of claim 7 wherein said steps of developing comprise:

(a) developing for a first period of time with said 5:1.8 developing solution;

(b) developing for a second period of time with both said 5:1.8 developing solution and said 5:2.7 developer; and (c) developing for a third period only with said 5:2.7 developer.

9. The method of claim 8 wherein all of said developing steps are carried out by spraying.

10. The method of claim 8 wherein said resist is exposed so as to obtain about a 50% developed thickness and wherein said first developing step is carried out for 5 seconds; said second step is carried out for 10 seconds and wherein said third step is carried out for 5 seconds.

11. The method according to claim 1 and further including the step of disposing a filter between said source and said substrate prior to exposing, said filter being such as to filter out M-line radiation but to pass L-line radiation whereby alignment of the mask and substrate can be carried out prior to exposure.

12. The method according to claim 1 and further including the step of doping said resist with bromine.

13. An improved method of developing a COP resist which as been exposed to x-ray radiation comprising the steps of first developing said resist in a developing solution having a concentration of approximately 5:1.8, the concentration being the ratio of MEK developer to an ethanol solvent for a short period of time and then developing said resist in a lower concentration of approximately 5:2.7 until development is completed.

14. The method of claim 13 wherein said steps of developing comprise:

(a) developing for a first period of time with said 5:1.8 developing solution;

(b) developing for a second period of time with both said 5:1.8 developing solution and said 5:2.7 developer; and (c) developing for a third period only with said 5:2.7 developer.

15. The method of claim 14 wherein all of said developing steps are carried out by spraying.

16. The method of claim 14 wherein said resist is exposed so as to obtain about a 50% developed thickness and wherein said first developing step is carried out for 5 seconds; said second step is carried out for 10 seconds and wherein said third step is carried out for 5 seconds.

* * * * *

UNITED STATES PATENT AND TRADEMARK OFFICE
CERTIFICATE OF CORRECTION

PATENT NO. : 4,215,192

DATED : July 29, 1980

INVENTOR(S) : William D. Buckley

It is certified that error appears in the above-identified patent and that said Letters Patent are hereby corrected as shown below:

Column 1, line 11, after microcircuits, insert a --,--, line 14, change "Electronic" to --Electronics--, line 21, change "angstroms" to --Angstroms--, lines 31 and 32, delete "Because of these factors," and insert --Consequently,--, line 35, change "severly" to --severely--, line 42, change "targets," to --tubes--.

line 45, change "lighography" to --lithography--, line 67, change "source" to --target--, Column 2, line 9, change "lithographical" to --lithographic--, line 21, delete "that were"

line 29, change "of more" to --higher--, line 35, change "impinging" to --impinge-- and after target, insert --to--, Column 3, line 16, after filament, delete "with" and insert --of--

UNITED STATES PATENT AND TRADEMARK OFFICE
CERTIFICATE OF CORRECTION

PATENT NO. : 4,215,192
DATED : July 29, 1980
INVENTOR(S) : William D. Buckley

It is certified that error appears in the above-identified patent and that said Letters Patent are hereby corrected as shown below:

Column 4, line 39, change "refining" to -- defining --.

line 50, change "has" to --had--,

Column 5, lines 28, 29, 40, 41, 57, 58 and 60, change "killowatts" to --kilowatts--, line 64, change "The" to --This--.

Column 6, line 52, change "Vacuum" too --Vacuum--.

Column 7, line 54, change "A" to --Å--,

Signed and Sealed this

Twenty-sixth Day of April 1983

[SEAL]

Attest:

GERALD J. MOSSINGHOFF

Attesting Officer     Commissioner of Patents and Trademarks